（12）United States Patent
Yu et al.

(10) Patent No.: US 8,729,706 B2
(45) Date of Patent: *May 20, 2014

(54) SEMICONDUCTOR STRUCTURE HAVING A PERMEABLE HARD MASK LAYER SEALING AN AIR GAP

(71) Applicant: Taiwan Semiconductor Manufacturing Co., Ltd., Hsin-Chu (TW)

(72) Inventors: Chen-Hua Yu, Hsinchu (TW); Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/666,050

(22) Filed: Nov. 1, 2012

(65) Prior Publication Data

US 2013/0049226 A1   Feb. 28, 2013

Related U.S. Application Data

(63) Continuation of application No. 12/965,078, filed on Dec. 10, 2010, now Pat. No. 8,319,342, which is a continuation of application No. 11/733,556, filed on Apr. 10, 2007, now Pat. No. 7,871,922.

(51) Int. Cl.
*H01L 23/522* (2006.01)
(52) U.S. Cl.
USPC .................................. 257/760; 257/E23.144
(58) Field of Classification Search
USPC ........................................................ 438/619
See application file for complete search history.

(56) References Cited

U.S. PATENT DOCUMENTS

| | | | |
|---|---|---|---|
| 6,555,467 B2 | 4/2003 | Hsu et al. | |
| 6,924,222 B2 | 8/2005 | Goodner et al. | |
| 7,084,479 B2 | 8/2006 | Chen et al. | |
| 7,125,793 B2 | 10/2006 | Liou et al. | |
| 7,202,153 B2 | 4/2007 | Coronel et al. | |
| 8,319,342 B2 * | 11/2012 | Liu et al. | 257/760 |
| 2002/0016058 A1 | 2/2002 | Zhao | |
| 2004/0214427 A1 | 10/2004 | Kloster et al. | |
| 2005/0164489 A1 | 7/2005 | Kloster et al. | |
| 2005/0181593 A1 | 8/2005 | Leu et al. | |
| 2006/0073423 A1 | 4/2006 | Gallagher | |
| 2008/0254600 A1 | 10/2008 | Liu et al. | |

\* cited by examiner

*Primary Examiner* — Stephen W Smoot
(74) *Attorney, Agent, or Firm* — Duane Morris LLP; Steven E. Koffs

(57) ABSTRACT

A method for forming a semiconductor structure includes forming a sacrificial layer over a substrate. A first dielectric layer is formed over the sacrificial layer. A plurality of conductive structures are formed within the sacrificial layer and the first dielectric layer. The sacrificial layer is treated through the first dielectric layer, at least partially removing the sacrificial layer and forming at least one air gap between two of the conductive structures. A surface of the first dielectric layer is treated, forming a second dielectric layer over the first dielectric layer, after the formation of the air gap. A third dielectric layer is formed over the second dielectric layer. At least one opening is formed within the third dielectric layer such that the second dielectric layer substantially protects the first dielectric layer from damage by the step of forming the opening.

20 Claims, 20 Drawing Sheets

SEMICONDUCTOR STRUCTURE HAVING A PERMEABLE HARD MASK LAYER SEALING AN AIR GAP

This application is a continuation of U.S. patent application Ser. No. 12/965,078, filed Dec. 10, 2010, now U.S. Pat. No. 8,319,342, which is a continuation of U.S. patent application Ser. No. 11/733,556, filed Apr. 10, 2007, now U.S. Pat. No. 7,871,922, both of which are expressly incorporated by reference herein in their entireties.

BACKGROUND OF THE INVENTION

1. Field of the Invention

The present invention relates, most generally, to methods for forming semiconductor structures, and more particularly to methods for forming interconnect structures of integrated circuits.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed along with techniques for overcoming manufacturing obstacles associated with these materials and requirements. In addition, interconnect structures with air gaps have been proposed and used to further reduce dielectric constants of layers and/or spaces between two neighboring conductive lines or layers.

FIG. 1 is a schematic drawing showing a traditional interconnect structure with air gaps. Copper lines 120 are formed over the substrate 100. Air gaps 110 are formed between the copper lines 120. A dielectric layer 130 is formed over the air gaps 110 to seal the air gaps 110 between the copper lines 120. A dielectric layer 150 and an etch stop layer 140 are sequentially formed over the dielectric layer 130. Dual damascene openings 160 are formed within the dielectric layer 150 and the etch stop layer 140, exposing the top surface (not labeled) of the copper lines 120 such that a copper layer can be formed within the dual damascene openings 160 for electrical connection.

The air gaps 110 have a dielectric constant k "1.0." The interconnect structure with the air gaps 110 shown in FIG. 1 thus desirably reduces parasitic capacitances between the copper lines 120. Therefore, the air-gap interconnect conductive structure has a desired resistance-capacitance (RC) time delay such that high-speed integrated circuits can be achieved.

Based on the foregoing, structures and methods for forming interconnect structures with air gaps are desired.

SUMMARY OF THE INVENTION

In accordance with some exemplary embodiments, a method for forming a semiconductor structure includes forming a sacrificial layer over a substrate. A first dielectric layer is formed over the sacrificial layer. A plurality of conductive structures are formed within the sacrificial layer and the first dielectric layer. The sacrificial layer is treated through the first dielectric layer so as to at least partially remove the sacrificial layer and forming at least one air gap between two of the conductive structures. A surface of the first dielectric layer is treated so as to form a second dielectric layer thereover after the formation of the air gap. A third dielectric layer is formed over the second dielectric layer. At least one opening is formed within the third dielectric layer, wherein the second dielectric layer substantially protects the first dielectric layer from damage by the step of forming the opening.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1:
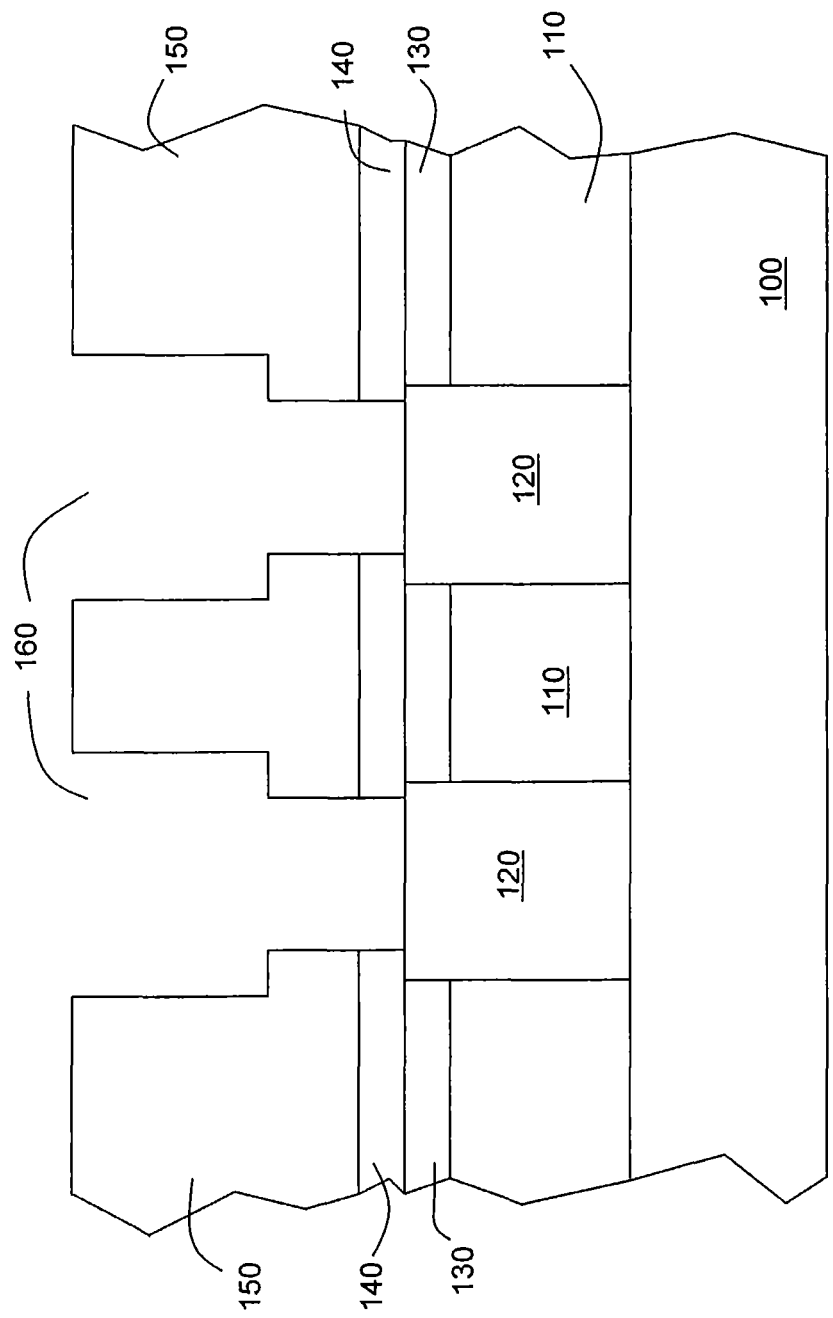
FIG. 1 is a schematic drawing showing a traditional via hole structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2J are schematic cross-sectional views showing an exemplary method for forming an exemplary interconnect structure.

Figure 2A:
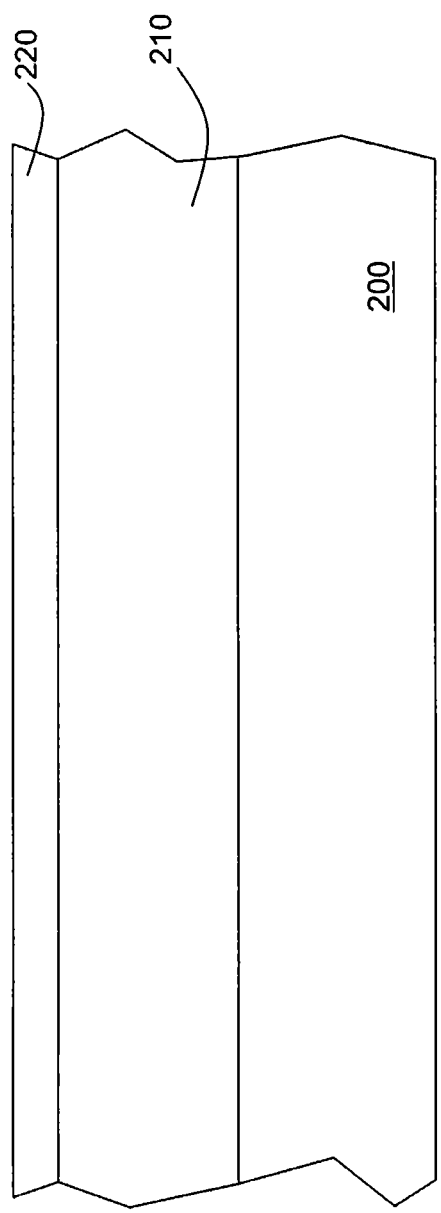
FIGS. 2A-2J are schematic cross-sectional views showing an exemplary method for forming an exemplary interconnect structure.

Referring to FIG. 2A, a sacrificial layer 210 and a dielectric layer such as a permeable hard mask layer 220 are sequentially formed over a substrate 200. The substrate 200 can be a silicon substrate, a III-V compound substrate, a display substrate such as a liquid crystal display (LCD), plasma display, electro luminescence (EL) lamp display, or a light emitting diode (LED) substrate (collectively referred to as, substrate 200), for example. In some embodiments, at least one of device, diode, transistor, circuit or combinations thereof (not shown) is formed within and/or on the substrate 200.

In some embodiments, the sacrificial layer 210 may comprise a layer including polymer (such as polypropylene glycol (PPG), polybutadine (PB), polyethylene glycol (PEG) and polycaprolactonediol (PCL)), fluorinated amorphous carbon (a-FiC), silicon gel, organic silaxone, porogen low-k dielectric material, other material that may decompose and/or vaporize by a thermal treatment at a temperature between about 250° C. and about 450° C., by UV treatment, or combinations thereof. The sacrificial layer 210 may be formed by, for example, a spin-on process, a chemical vapor deposition (CVD) process or combinations thereof. For embodiments using 22-nm or less technology, the sacrificial layer 210 may have a thickness between about 500 Å and about 1,500 Å. The thickness of the sacrificial layer 210, however, is not limited thereto. The thickness of the sacrificial layer 210 may vary with the technology for manufacturing an interconnect structure.

The permeable hard mask layer 220 may comprise at least one material including Black Diamond™ (Applied Materials), SiLK™ (Dow Chemical Company), silicon oxycarbide, and combinations thereof. The hard mask layer 220 is selectively permeable by a decomposition product of the sacrificial layer material, as described below. In some embodiments, the hard mask layer 220 is also selectively permeable by a solvent, etchant or plasma that is used to decompose the sacrificial layer material, as described below.

In some embodiments, the permeable hard mask layer 220 may be formed by, for example, a CVD process such as a high density plasma CVD (HDPCVD) process using at least one silicon-containing gas such as silane ($SiH_4$), argon (Ar) and oxygen. For embodiments using 22-nm or less technology, the permeable hard mask layer 220 may have a thickness between about 300 Å and about 1,000 Å. The thickness of the permeable hard mask layer 220, however, is not limited thereto. The thickness of the permeable hard mask layer 220 may vary with the technology for manufacturing an interconnect structure. In some embodiments, the permeable hard mask layer 220 may have a dielectric constant (k) of about 3 or less.

Figure 2B:
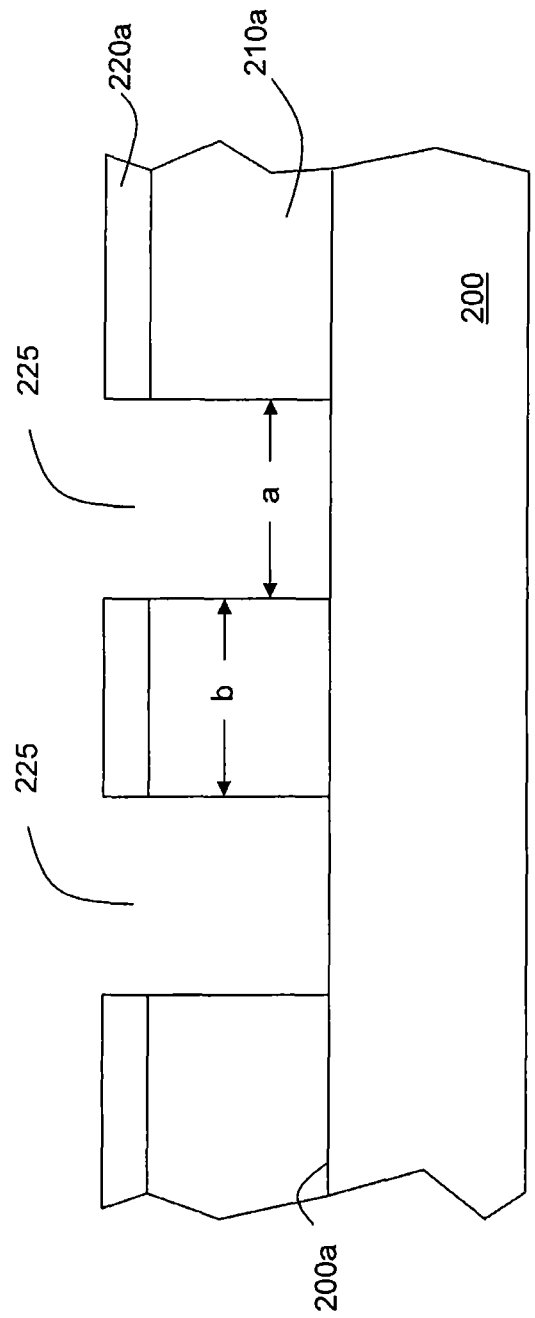

Referring to FIG. 2B, at least one opening (e.g., openings 225) are formed within the sacrificial layer 210 and the permeable hard mask layer 220, partially exposing a top surface 200a of the substrate 200. After the formation of the openings 225, the remaining sacrificial layer 210a and permeable hard mask layer 220a are formed as shown in FIG. 2B. The openings 225 can be formed by, for example, forming a patterned photoresist layer (not shown) over the permeable hard mask layer 220 (shown in FIG. 2A) by a photolithographic process. An etch process patterns the sacrificial layer 210 and the permeable hard mask layer 220 through the patterned photoresist layer (not shown). After the etch process step, a photoresist removing process is applied to remove the patterned photoresist layer. By these steps, the openings 225 are formed within the dielectric layer 210a and the permeable hard mask layer 220a.

In some embodiments, the openings 225 can be, for example, contact openings, via openings, damascene openings, dual damascene openings, or the like or combinations thereof. For embodiments using 22-nm or less technology, the openings 225 may have a width "a" of about 300 Å or more and the space "b" between the openings 225 may be about 300 Å or more. The width "a" and the space "b", however, are not limited thereto. The width "a" and the space "b" may vary with the technology for manufacturing an interconnect structure.

Figure 2C:
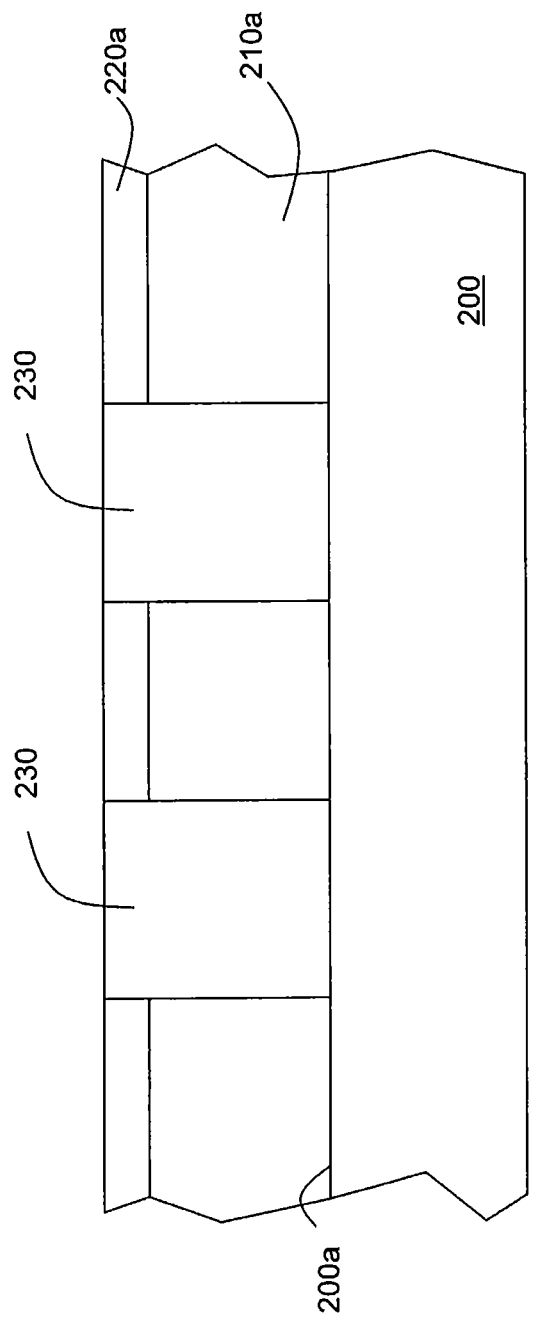

Referring to FIG. 2C, more than one conductive structures 230 are substantially formed within the openings 225 such that the conductive structures 230, the sacrificial layer 210a and the permeable hard mask layer 220a have a substantially planar surface. The conductive structures 230 may comprise, for example, a barrier layer containing a material such as titanium (Ti), titanium nitride (TiN), tantalum (Ta), tantalum nitride (TaN) or the like; a seed layer such as a copper seed layer; and/or a conductive material such as copper (Cu), aluminum (Al), AlCu or the like. The barrier layer, seed layer and/or conductive material can be formed by, for example, a CVD process, a physical vapor deposition (PVD) process, an electrochemical plating process, an electroless plating process, or the like or combinations thereof. In some embodiments, the conductive structures 230 can be, for example, contacts, vias, trenches, damascenes, dual damascenes or the like. The conductive structures 230 contact diodes, devices, transistors and/or circuits (not shown) formed within or over the substrate 200 for electrical connections.

Figure 2D:
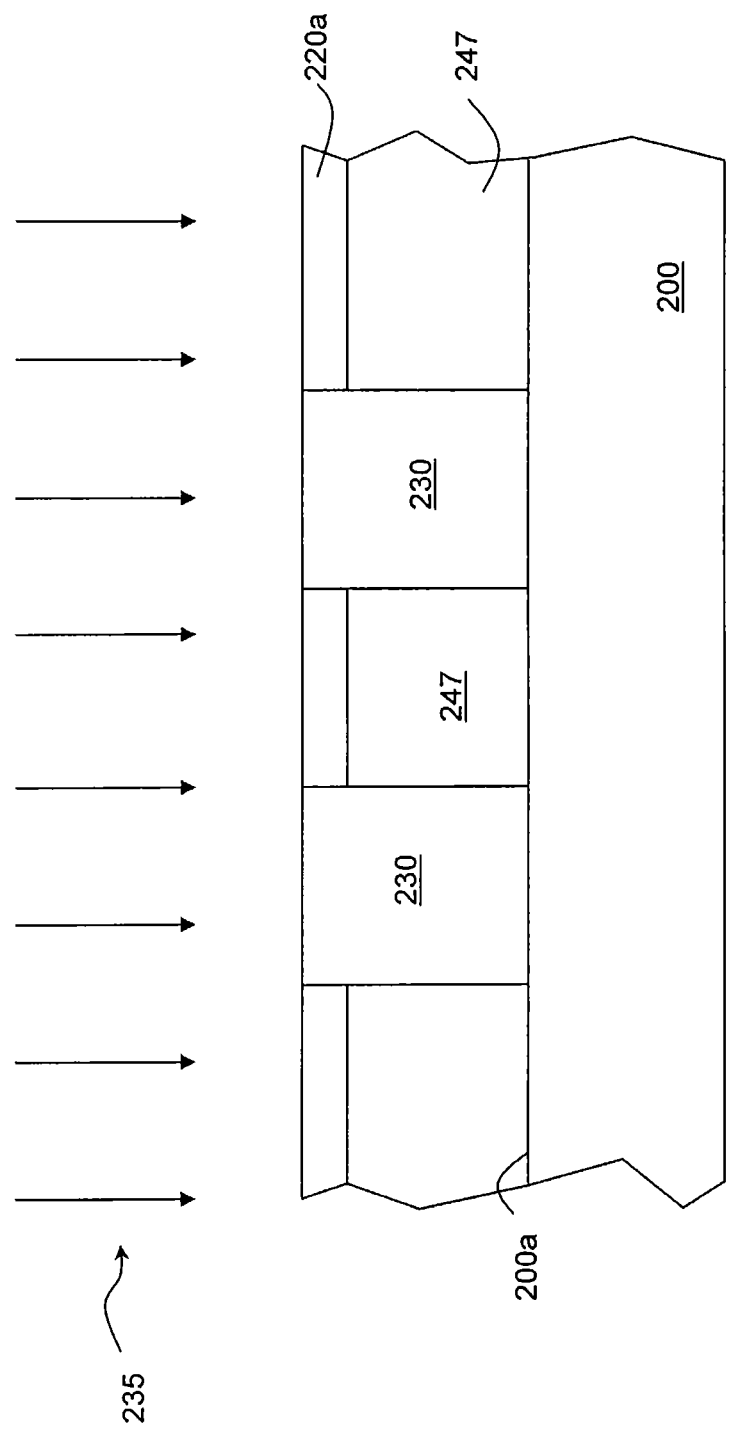

Referring to FIG. 2D, the structure of FIG. 2C is subjected to a treatment 235 for at least partially removing the sacrificial layer 210a (shown in FIG. 2C). The treatment may comprise a thermal treatment, a ultra-violet (UV) treatment, a solution treatment, a vapor treatment or combinations thereof. The treatment 235 treats the sacrificial layer 210a through the permeable hard mask 220a, thereby at least partially removing the sacrificial layer 210a (shown in FIG. 2C), thereby forming at least one structure 247 containing an air gap between the conductive structures 230. The sacrificial layer 210a is vulnerable to the treatment 235 and decomposes. The sacrificial layer 210a breaks down into small gas molecules which diffuse out through the permeable hard mask layer 220a. In some embodiments, the sacrificial layer 210a can be removed by a wet or dry etching process, wherein the generated liquid, gases or plasma may penetrate the permeable hard mask 220a and be removed.

In some embodiments, the sacrificial layer 210a is not completely removed. The structure 247 containing the air gap may comprise, for example, the remains of the sacrificial layer 210b around an air gap 248 as shown in FIG. 2K. The remaining sacrificial layer 210b may remain around the air gap 248 as long as the structure 247 can provide a desired dielectric constant and/or the structure with the structure 247 containing the air gap may have a desired mechanical strength for preventing collapse of the permeable mask layer 220a or other structure formed (not shown) thereover. In still other embodiments, the structure 247 does not have a contiguous air gap and only has porous sacrificial layer 210b, containing a plurality of small pores or bubbles. In this variation, the structure 247 may have the remaining sacrificial layer 210b, which is less dense than the sacrificial layer 210a.

Figure 2E:
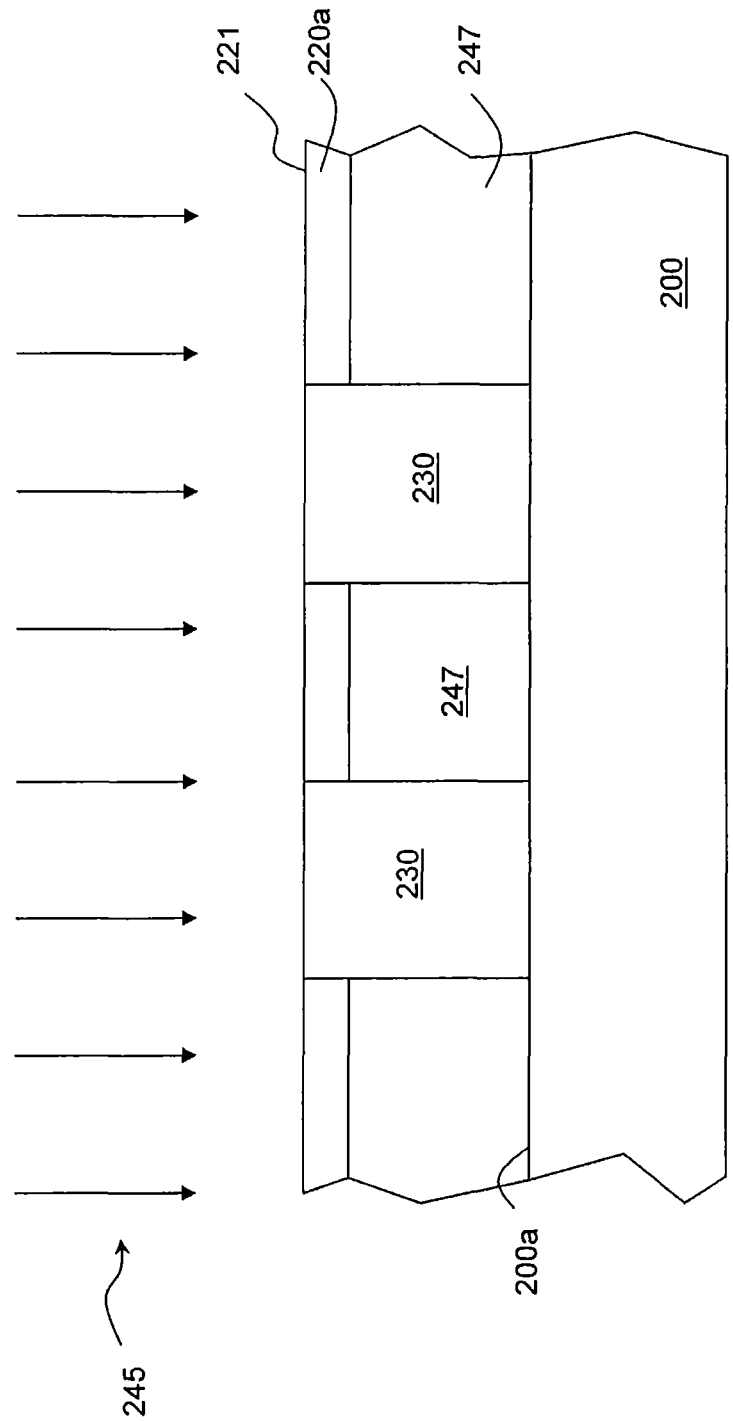
Figure 2F:
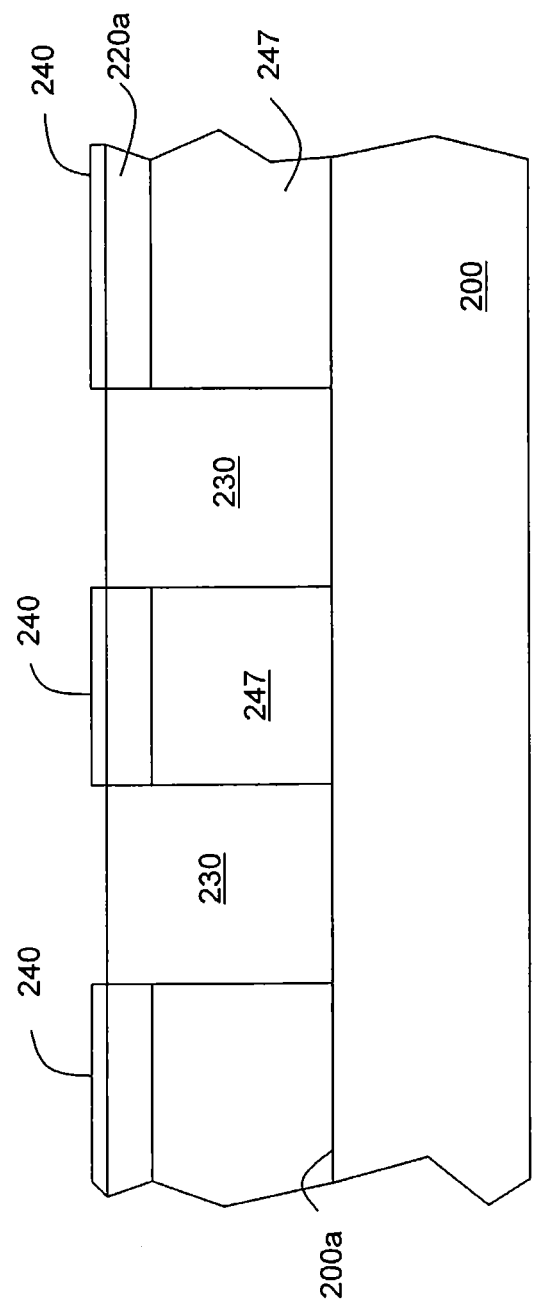

Referring to FIG. 2E, the surface 221 of the permeable hard mask layer 220a is subjected to a treatment 245 so as to form a dielectric layer 240 (shown in FIG. 2F) formed over the permeable hard mask layer 220a. In some embodiments, the dielectric layer 240 may be formed over the permeable hard mask layer 220a. In the variation, the dielectric layer 240 and the permeable hard mask layer 220a are two different layers. In other embodiments, the dielectric layer 240 may be formed at the top portion of the permeable hard mask layer 220a. In this variation, chemicals may diffuse into and interact with the permeable hard mask layer 220a. Therefore, the dielectric layer 240 includes a part of the permeable hard mask layer 220a. The dielectric layer 240 can be a low-k dielectric layer, an oxide layer, a nitride layer, an oxynitride layer or a layer containing nitrogen, carbon and/or oxygen. In some embodiments, the dielectric layer 240 may be denser than the permeable hard mask layer 220a.

In some embodiments, the dielectric layer 240 is formed by immersing the surface 221 of the permeable hard mask layer 220a within a solution including 3-[2-(trimethoxysilyl)ethyl] pyridine, 2-(trimethoxysilyl)ethyl benzene, n-propyl trimethoxysilane, phenyl trimethoxysilane or the like. In some embodiments, the solute containing at least one of the 3-[2-(trimethoxysilyl)ethyl]pyridine, 2-(trimethoxysilyl) ethyl benzene, n-propyl trimethoxysilane, phenyl trimethoxysilane may have about 10 milliliter (ml) and the solvent may be toluene having an amount of about 5,000 ml. In some embodiments, the solution has a concentration between about 2M and about 10M. The surface 221 of the permeable hard mask 220a may be immersed in the solution at about room temperature for about 1 hour. After the immersion process, the substrate 200 may be subjected to a cleaning process using toluene, acetone and/or ethanol. The substrate 200 may be immersed within toluene between about 10 seconds and about 600 seconds, preferably, about 30 seconds; acetone between about 10 seconds and about 600 seconds, preferably, about 30 seconds and/or ethanol between about 10 seconds and about 600 seconds, preferably, about 30 seconds. After the cleaning process, the substrate 200 may be dried by, for example, a nitrogen flow. By immersing the surface 221 of the permeable hard mask layer 220a within the solution, the dielectric layer 240 may include mecaptopropyltrimethoxysilane (MPTMS) with chemical formula $HS(CH_2)_3Si(OCH_3)_3$ therein. In some embodiments, the dielectric layer 240 is formed over the permeable hard mask layer 220a, and is not substantially formed on the surface (not labeled) of the conductive structures 230.

In other embodiments, the dielectric layer 240 is formed by exposing the surface 221 of the permeable hard mask layer 220a within a vapor ambient or a steam ambient containing 3-[2-(trimethoxysilyl)ethyl]pyridine, 2-(trimethoxysilyl) ethyl benzene, n-propyl trimethoxysilane, phenyl trimethoxysilane or the like. The surface 221 of the permeable hard mask layer 220 may be exposed to the vapor or steam ambient between about 60 seconds and about 7,200 seconds. After the exposing process, the substrate 200 may be subjected to a cleaning process using toluene, acetone and/or ethanol. The substrate 200 may be immersed within toluene between about 10 seconds and about 600 seconds, preferably, about 30 seconds; acetone between about 10 seconds and about 600 seconds, preferably, about 30 seconds and/or ethanol between about 10 seconds and about 600 seconds, preferably, about 30 seconds. After the cleaning process, the substrate 200 may be dried by, for example, a nitrogen flow. The dielectric layer 240 may include mecaptopropyltrimethoxysilane (MPTMS) with chemical formula $HS(CH_2)_3Si(OCH_3)_3$ therein. In some embodiments, the dielectric layer 240 is formed over the permeable hard mask layer 220a, and is not substantially formed on the top surface (not labeled) of the conductive structures 230.

In still other embodiments, the dielectric layer 240 is formed by plasma treating the surface 221 of the permeable hard mask layer 220a. The plasma treatment may use a precursor including at least one of silane ($SiH_4$), ammonia ($NH_3$), nitrogen/hydrogen ($N_2/H_2$), carbon dioxide ($CO_2$), methane ($CH_4$), helium (He), oxygen, nitrogen, argon (Ar) or the like. The plasma treatment may have a processing temperature between about 150° C. and about 450° C., preferably about 400° C.; and a processing pressure between about 0.1 milli-Torr (mTorr) and about 200 mTorr, preferably about 10 mTorr.

In some embodiments, the dielectric layer 240 is formed by, for example, a CVD process, a spin-on process or the like. In the embodiments using a CVD process, a spin-on process or the like, the dielectric layer 240 may be substantially conformally formed over the permeable hard mask layer 220a, covering the conductive structures 230. The dielectric layer 240 may be partially removed by a subsequent etch process (e.g., an etch step shown in FIG. 2G) which exposes the surfaces of the conductive structures 230 such that conductive material 270 (shown in FIG. 2J) may be formed for electrical connections.

In some embodiments, the dielectric layer 240 may have a dielectric constant between about 3 to about 6. In some embodiments, the dielectric constant of the dielectric layer 240 is higher than that of the permeable hard mask layer 220a. For embodiments using 22-nm or less technology, the dielectric layer 240 may have a thickness between about 50 Å and about 300 Å.

Figure 2G:
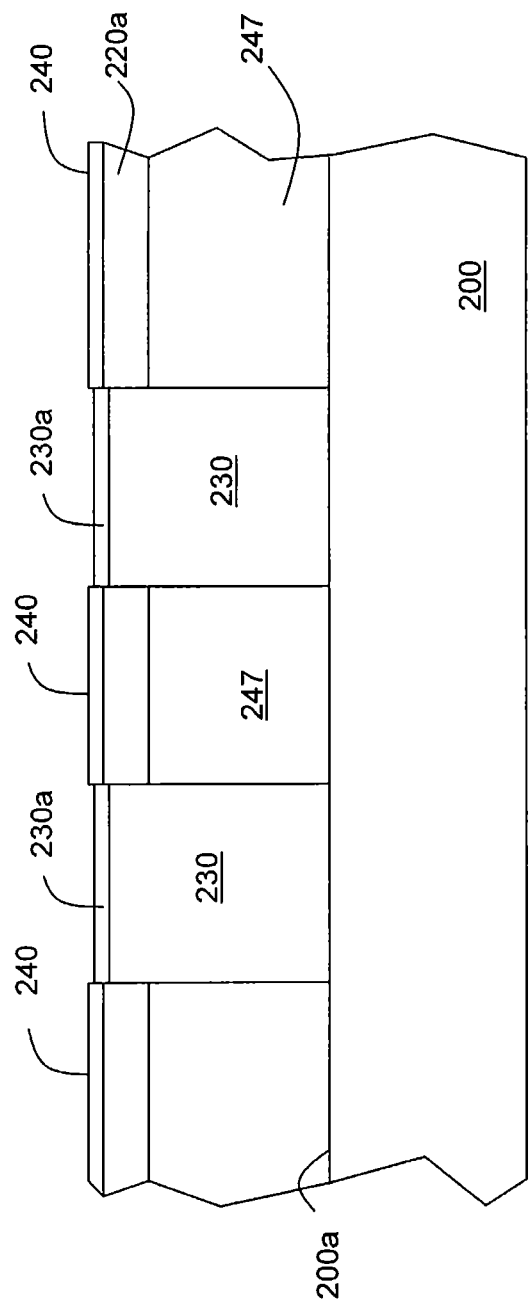

Referring to FIG. 2G, cap layers 230a are formed over the conductive structures 230. The cap layers 230a are provided to protect the conductive structures 230 from being damaged by a subsequent etch process (e.g., an etch process shown in FIG. 2I) and/or to desirably achieve adhesion of the top surfaces of the conductive structures 230 so as to achieve a desired reliability. The cap layers 230a may comprise a dielectric cap including material such as copper silicon nitride (CuSiN) or the like and/or a metallic cap including material such as cobalt tungsten boride (CoWB), cobalt tungsten phosphide (CoWP) or the like. For embodiments using CuSiN, the cap layers 230a can be formed by, for example, plasma treating the conductive structures 230 in an ambient including precursors such as silane and nitrogen. For embodiments using CoWB or CoWP, the cap layers 230a may be formed by, for example, electroplating CoWB or CoWP on the conductive structures 230. For embodiments using an electroplating process, the cap layers 230a are formed on the top surfaces (not labeled) of the conductive structures 230 and are not substantially formed on the top surface (not labeled) of the dielectric layer 240.

In some embodiments, the cap layers 230a may be formed after the formation of the dielectric layer 240 (as shown in FIGS. 2F and 2G). In other embodiments, the cap layers 230a may be formed before the formation of the dielectric layer 240. In some embodiments, the cap layers 230a and the process for forming the cap layers 230a may be omitted if a subsequent etch process (e.g., the etch process shown in FIG. 2I) may not substantially damage the conductive structures 230 and/or the top surfaces of the conductive structures 230 may provide a desired reliability.

Figure 2H:
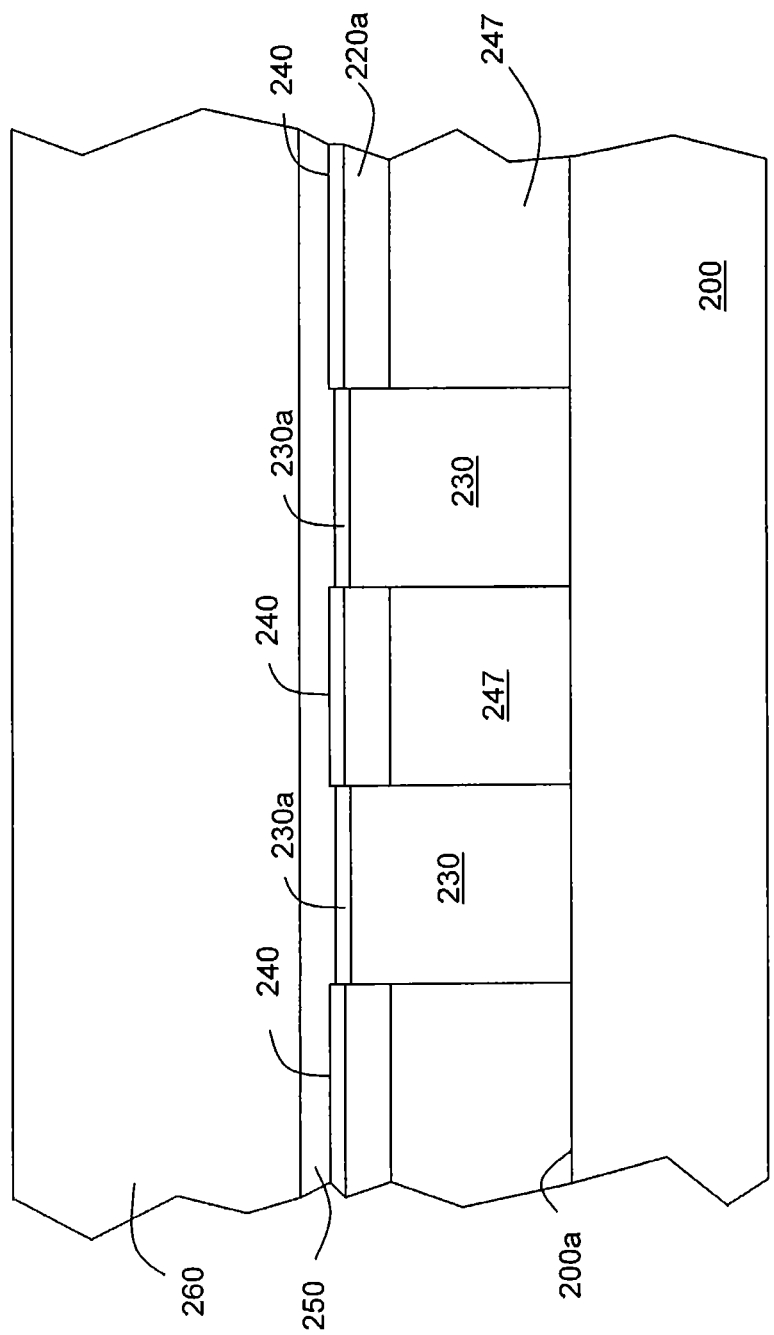

Referring to FIG. 2H, an etch stop layer 250 and at least one dielectric layer such as dielectric layer 260 are sequentially formed over the dielectric layer 240 and the cap layers 230a. The etch stop layer 250 may comprise a dielectric layer such as a silicon carbide oxide (SiCO) layer, a silicon carbide nitride (SiCN) layer, a silicon carbide (SiC) layer, a silicon oxide layer, a silicon nitride layer, a silicon oxynitride layer, low-k dielectric layer or the like. The etch stop layer 250 may be formed, for example, by a CVD process. The etch stop layer 250 is provided to prevent the conductive structures 230 from being substantially damaged by a sequent etch process and/or provides an end-point detection for the subsequent etch process (e.g., the etch process shown in FIG. 2I). In some embodiments, the etch stop layer 250 may be omitted if a subsequent etch process (e.g., the etch process shown in FIG. 2I) may not substantially damage the conductive structures 230 by the existence of the cap layer 230a.

The dielectric layer 260 may comprise, for example, a ultra low-k material layer or a low-k material layer. In some embodiments, the materials and methods for forming the dielectric layer 260 may be similar to the dielectric layer 210 described in FIG. 2A. The dielectric layer 260 may be formed by a CVD process, spin-on process or other process that is adapted to form a low-k material layer.

In order to reduce parasitic capacitance within an interconnect structure, it is desired that the etch stop layer 250 and/or the dielectric layer 260 have desired dielectric constants such that the parasitic capacitances of the interconnect structure are maintained at or below a desired level.

Figure 2I:
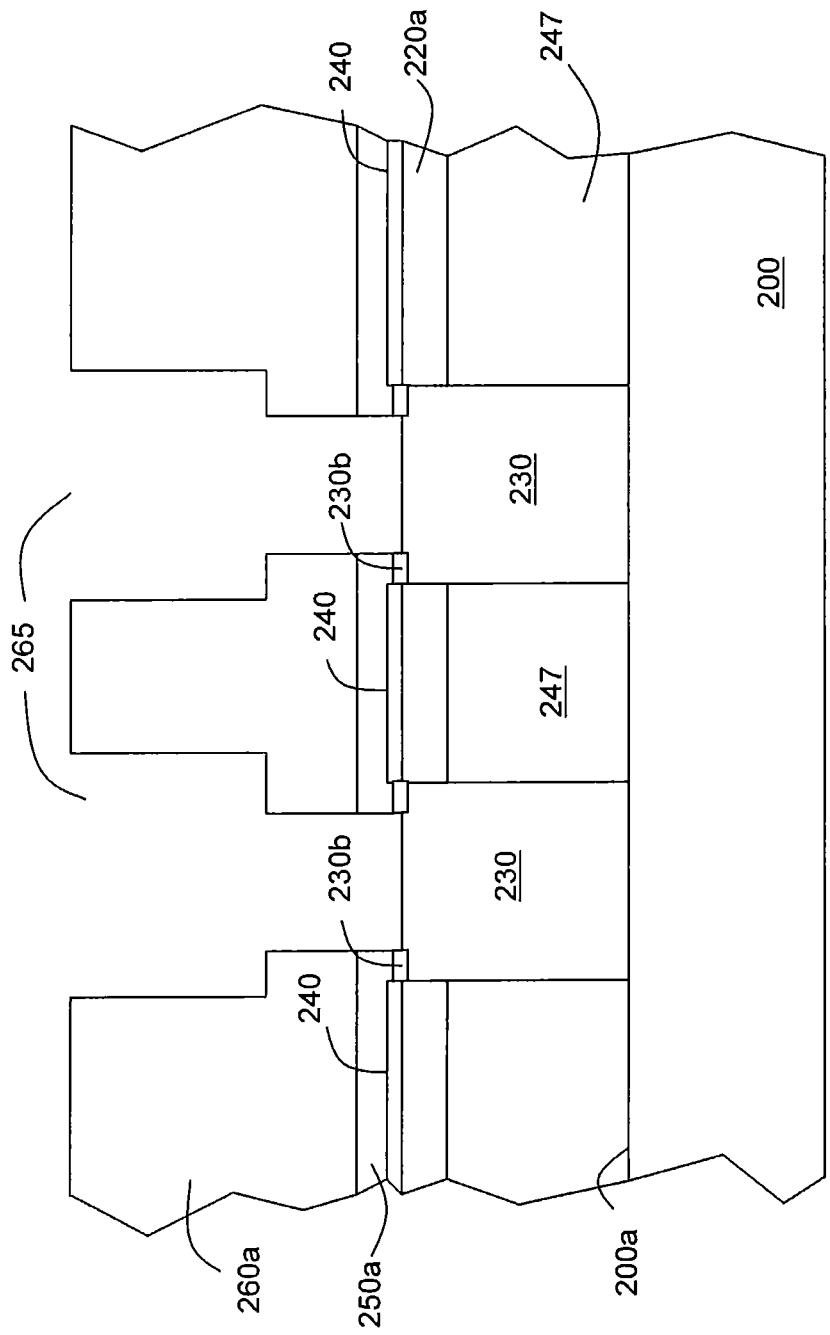

FIG. 2I is a schematic cross-sectional view showing that openings are formed within a dielectric layer, exposing top surfaces of conductive structures without substantial misalignment.

Referring to FIG. 2I openings 265 are formed within the dielectric layer 260, the etch stop layer 250 and through the cap layers 230a, thereby forming the patterned dielectric layer 260a, the patterned etch stop layer 250a and the cap layers 230b. The openings 265 can be dual damascene openings, damascene openings, trench openings, contact openings, via openings or the like. In some embodiments using a damascene process, the process of forming the openings 265 may comprise a via opening process and a trench opening process. The via opening process and the trench opening process can be performed in either sequence (i.e., via first or trench first). In some embodiments, the via opening process or the trench opening process may comprise an etch process for partially removing the etch stop layer 250 and/or the cap layers 230a, thereby partially exposing top surfaces (not labeled) of the conductive structures 230. In the embodiment shown in FIG. 2I, the alignment of the openings 265 and the conductive structures 230 is desired such that the bottom region (not labeled) of the openings 265 only exposes top surfaces (not labeled) of the conductive structures 230 without exposing sidewalls and/or top surfaces of the dielectric layer 240.

Figure 2J:
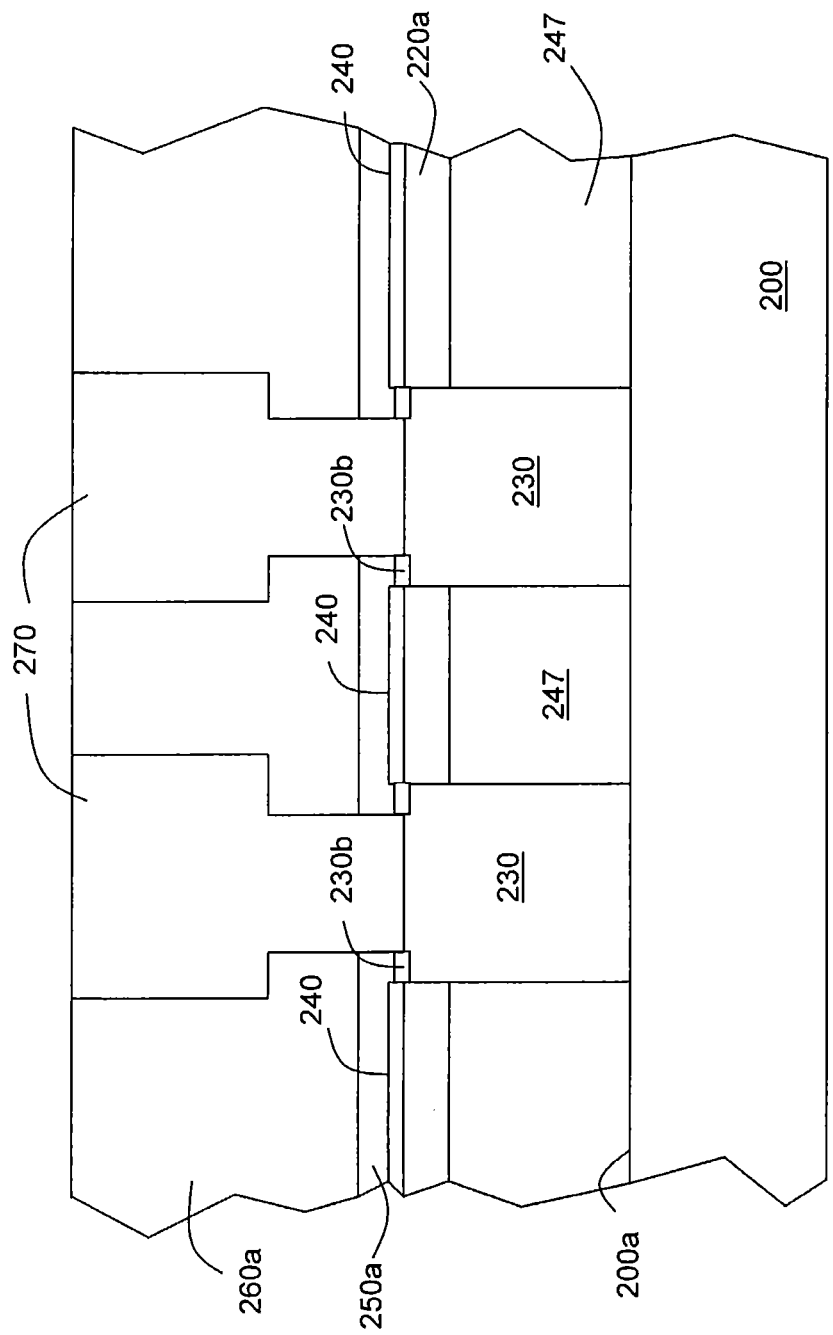
Figure 2K:
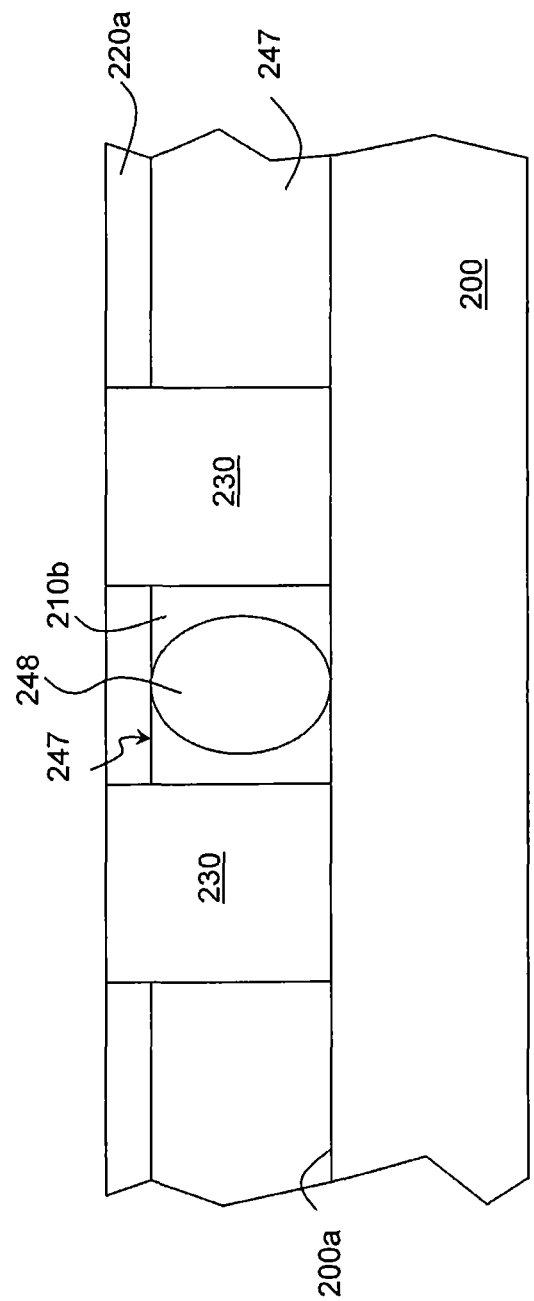
FIG. 2K is a schematic cross-sectional view showing an exemplary air gap structure.

Referring to FIG. 2J, more than one conductive structures 270 are substantially formed within the openings 265 (i.e., within the dielectric layer 260a, the etch stop layer 250a and the cap layers 230b shown in FIG. 2I). The conductive structures 270 may comprise, for example, a barrier layer containing a material such as titanium (Ti), titanium nitride (TiN), tantalum (Ta), tantalum nitride (TaN) or the like; a seed layer such as a copper seed layer; and/or a conductive material such as copper (Cu), aluminum (Al), AlCu or the like. The barrier layer, seed layer and/or conductive material can be formed by, for example, a CVD process, a physical vapor deposition (PVD) process, an electrochemical plating process, an electroless plating process or other process that is adapted to form a film layer. In some embodiments, the conductive structures 270 can be, for example, contacts, vias, trenches, damascenes, dual damascenes or the like. Each of the conductive structures 270 contacts the respective conductive structure 230 for electrical connections with diodes, devices, transistors and/or circuits (not shown) formed on or within the substrate 200.

Figure 3A:
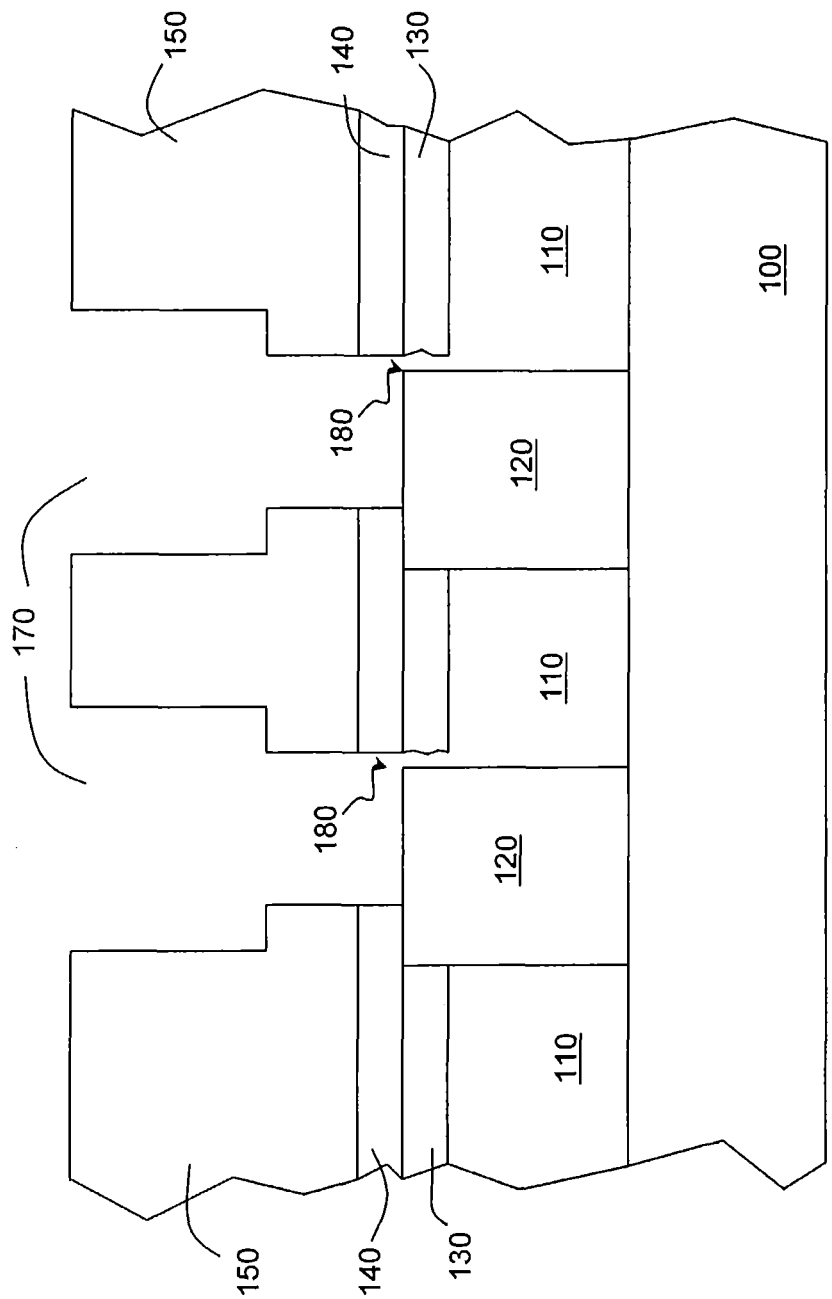
FIG. 3A is a schematic cross-sectional view of a prior art interconnect structure with misalignment.

It is found that the prior art interconnect structure shown in FIG. 1 raises an issue when undesired misalignment between the dual damascene openings 170 and the copper lines 120 occurs. Referring to FIG. 3A, when an undesired misalignment between the dual damascene openings 170 and the copper lines 120 occurs, an etch process used to form the dual damascene openings 170 damages the dielectric layer 130. Since the dielectric layer 130 is a porous low-k dielectric layer or a low-k dielectric layer which has a low density, the dielectric layer 130 is vulnerable to the etch process. Therefore, the etch process may undesirably damage the dielectric layer 130, resulting in gaps 180 formed through the dielectric layer 130 and/or between the dielectric layer 130 and the copper layers 120. The gap 180 may expose the air gap 110 formed under the dielectric layer 130. Structures formed over the connection of the gap 180 and the air gap 110 may result in problems to following processes such as wet cleaning process and/or barrier/Cu-seed/Cu-plating processes. The chemicals used in the subsequent processes may remain in or flow through the gaps 180 and/or air gaps 110. The situation may result in metal bridging, poor reliability and/or collapse of the interconnect structure of FIG. 3A.

Figure 3B:
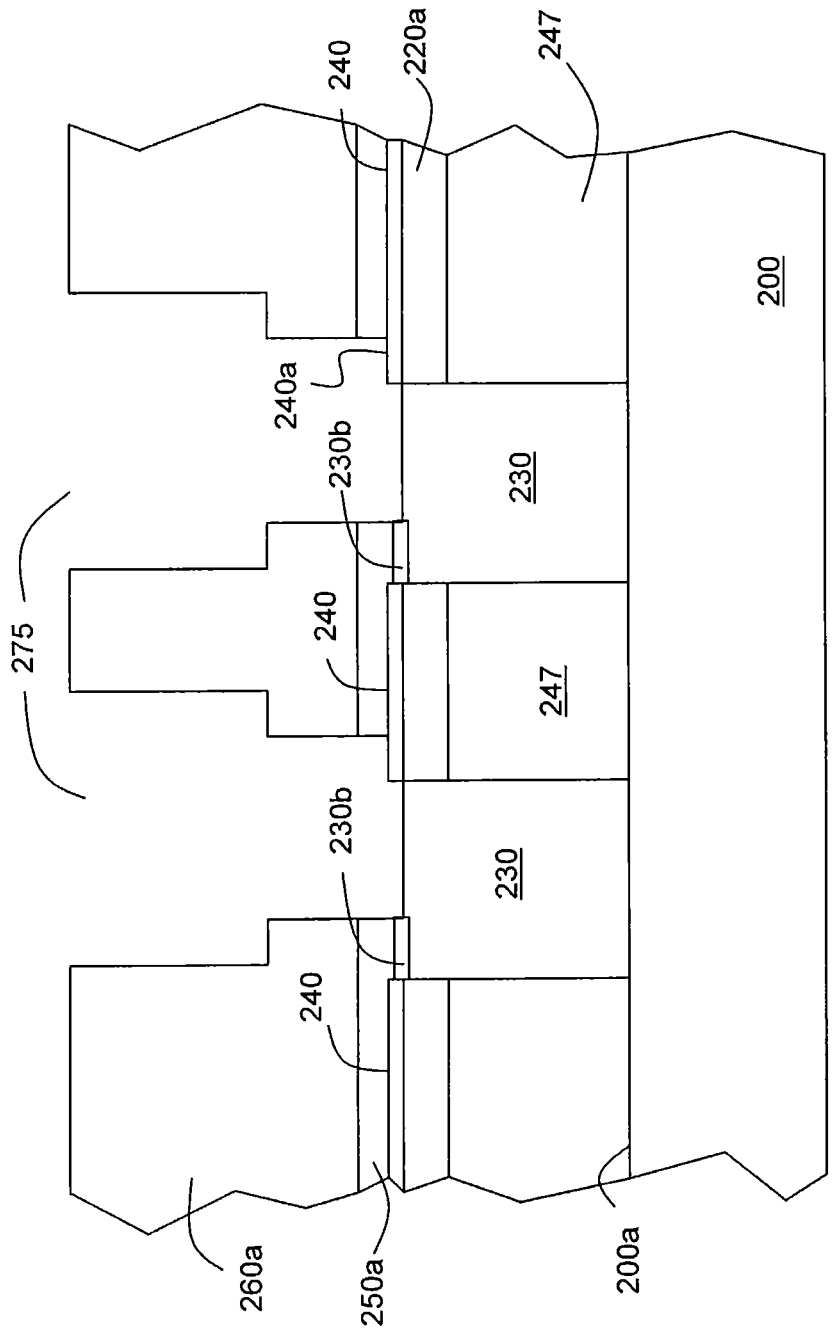
FIGS. 3B and 3C are schematic cross-sectional views of an exemplary interconnect structure with misalignment.

FIG. 3B is a schematic cross-sectional view of an exemplary interconnect structure with a misalignment between openings 275 and conductive structures 230.

Referring to FIG. 3B, when a misalignment between the bottom region (not labeled) of the openings 275 and the conductive structures 230 occurs, the etch process of forming the openings 275 at least partially exposes sidewalls and/or top surfaces 240a of the dielectric layer 240. Since the dielectric layer 240 is denser than the permeable hard mask layer 220a, the etch process for forming the openings 275 may stop at the dielectric layer 240 or the permeable hard mask layer 220a without substantially damaging the permeable hard mask layer 220a. The permeable hard mask layer 220a and the conductive structures 230 may seal the air gap structure 247. Therefore, the formation of the dielectric layer 240 over the permeable hard mask layer 220a may desirably solve the metal bridging, reliability and/or collapse issue described above in connection with FIG. 3A.

Figure 3C:
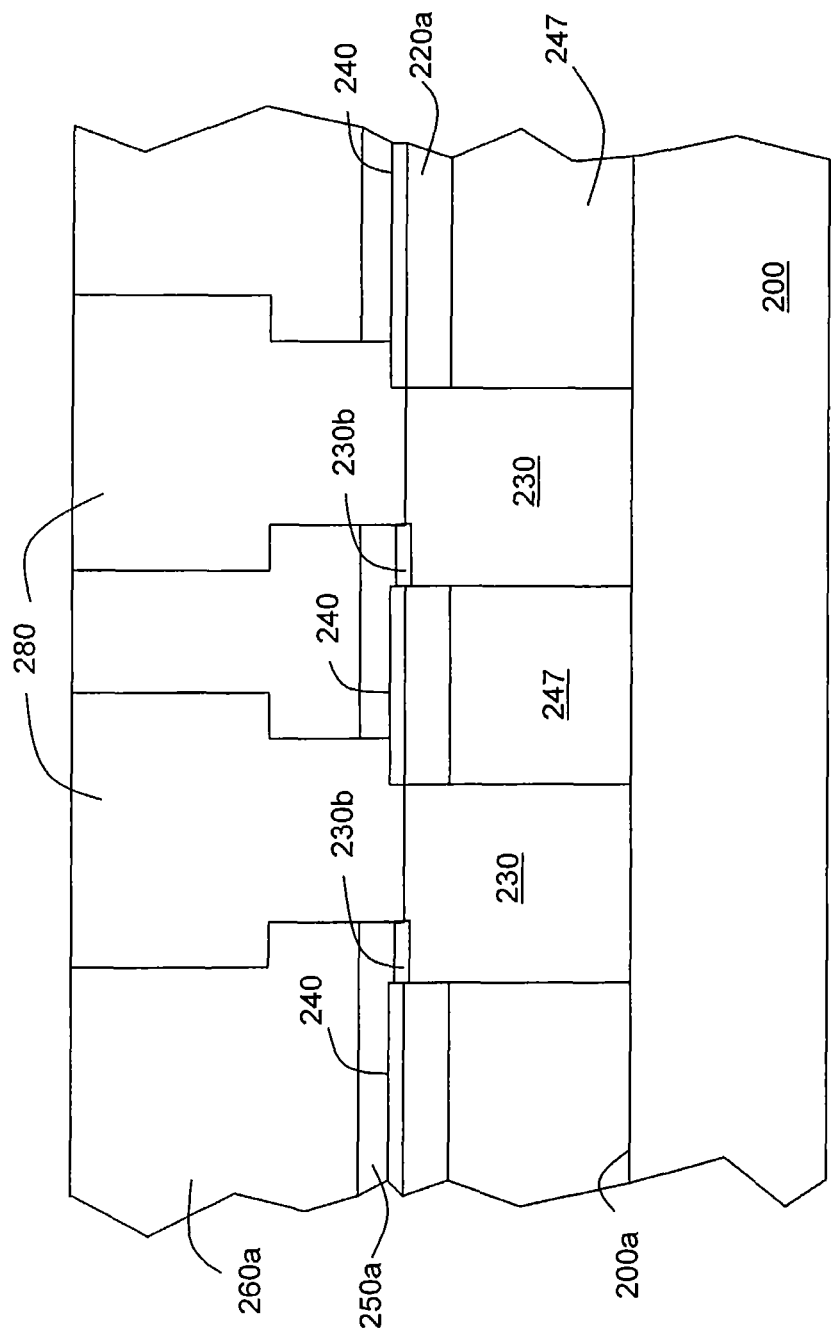

FIG. 3C is a schematic cross-sectional view of an exemplary interconnect with a misalignment.

Referring to FIG. 3C, conductive structures 280 are formed within the openings 275 (shown in FIG. 3B). The conductive structures 280 may be similar to the conductive structures 270 shown in FIG. 2J. In some embodiments, each of the conductive structures 280 contacts the dielectric layer 240 and the conductive structure 230, extending from the top surface (not labeled) of the conductive structure 230, a sidewall (not labeled) of the dielectric layer 240 and to at least a part of the top surface of the permeable hard mask layer 240. In some embodiments, each of the conductive structures 280 contacts the permeable hard mask layer 220a and sidewalls of the dielectric layer 240. Accordingly, the conductive structures 280 contact the conductive structures 230 for electrical connections with diodes, devices, transistors and/or circuits (not shown) formed on or within the substrate 200 without the concern described above in FIG. 3A.

FIGS. 4A-4D are schematic drawings showing another exemplary method for forming an interconnect structure with air gap.

Figure 4A:
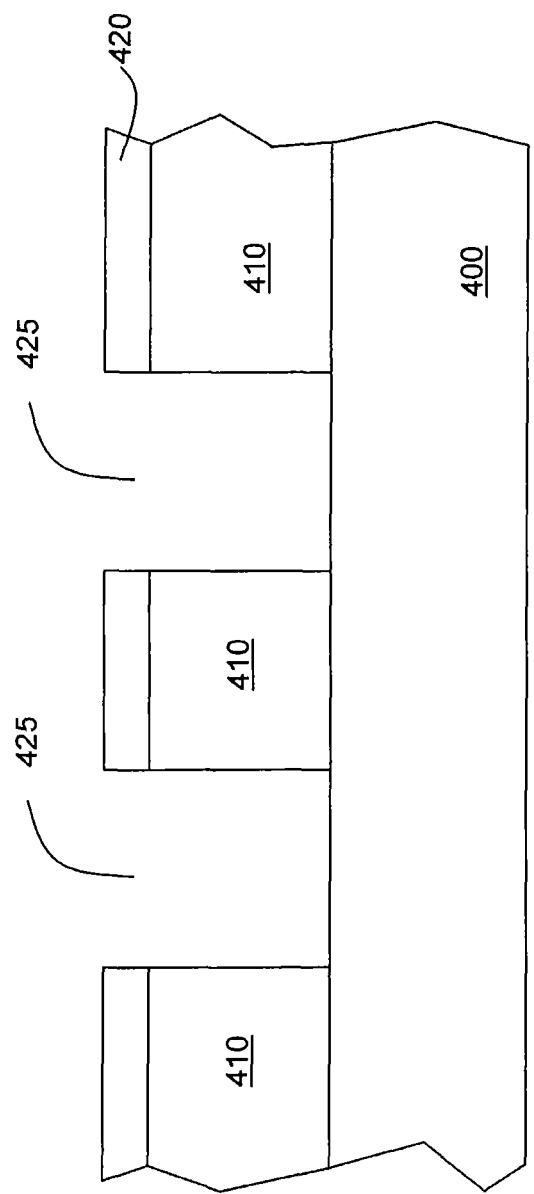
FIGS. 4A-4D are schematic cross-sectional views showing an exemplary method for forming another exemplary interconnect structure.

Referring to FIG. 4A, a sacrificial layer 410 and a dielectric layer such as a permeable hard mask layer 420 are sequentially formed over a substrate 400. Openings 425 are formed within the dielectric layer 420 and the sacrificial layer 410, partially exposing the sacrificial layer 410, i.e., sidewalls (not labeled) of the sacrificial layer 410. In some embodiments, the materials and methods for forming the substrate 400 and dielectric layer 420 may be similar to those of the substrate 200 and the dielectric layer 220 shown in FIG. 2A. The methods for forming the openings 425 may be similar to, for example, the methods for forming the openings 225 shown in FIG. 2B.

In some embodiments, the sacrificial layer 410 may comprise a layer photosensitive porogen material. The photosensitive porogen material may comprise a matrix material and a photosensitive material. In some embodiments, the material may be either a positive tone or negative tone. The photosensitive material may be stripped, leaving the matrix in place as described above in connection with FIG. 2A. In some embodiments, the photosensitive porogen material may comprise about 1% matrix at about 99% porogen. In other embodiments, the matrix material may comprise about 99% of the dielectric layer 410 and the porogen about 1% of the dielectric layer 410.

Figure 4B:
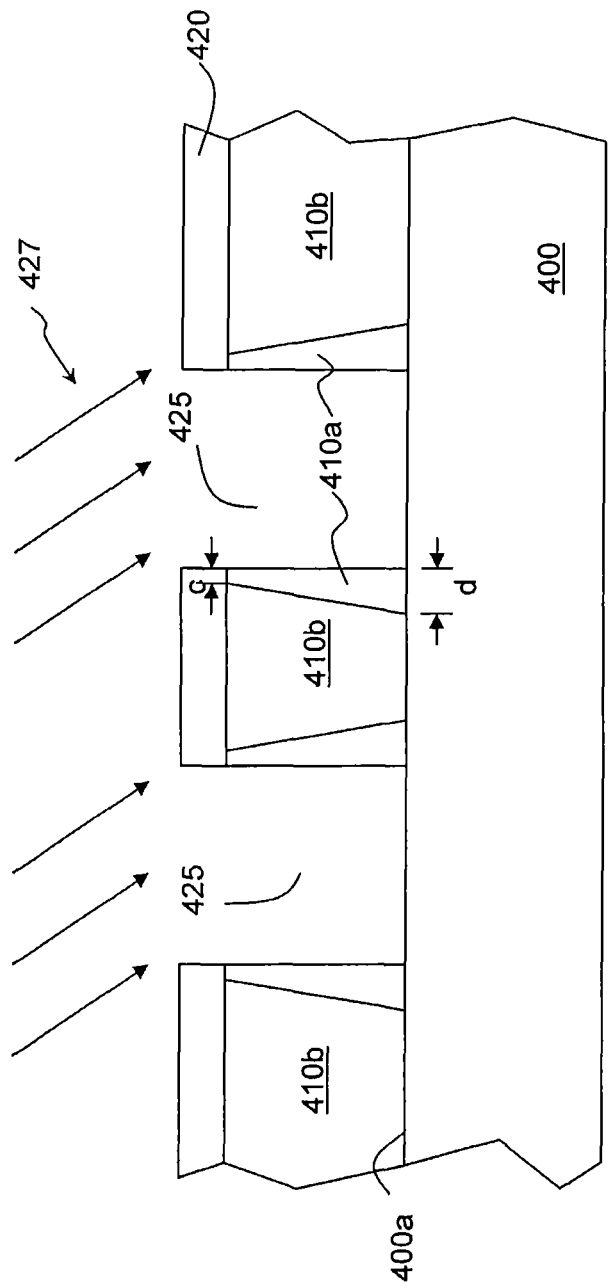

Referring to FIG. 4B, the sidewalls of the openings 425 are subjected to a treatment 427 such as a UV treatment or an e-beam radiation so as to solidify the treated region of the sacrificial layer 410 to form the hardened regions 410a. In some embodiments, the sacrificial layer 410 may comprise a negative tone material such that the layers 410a are relatively harder after being treated by UV exposure or e-beam radiation than the untreated regions 410b.

In some embodiments, the bottom region of the hardened regions 410a may have a width "d" larger than the width "c" of the top region of the hardened regions 410a.

Figure 4C:
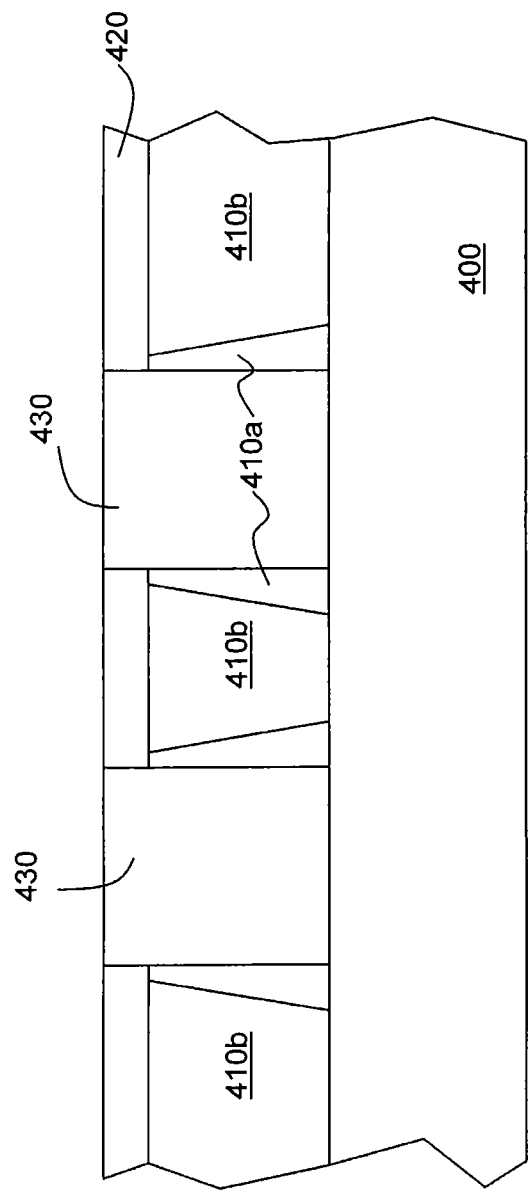

Referring to FIG. 4C, a plurality of conductive structures 430 are formed within the openings 425 shown in FIG. 4B. The materials and methods for forming the conductive structures 430 may be similar to, for example, those of the conductive structures 230 shown in FIG. 2C.

Figure 4D:
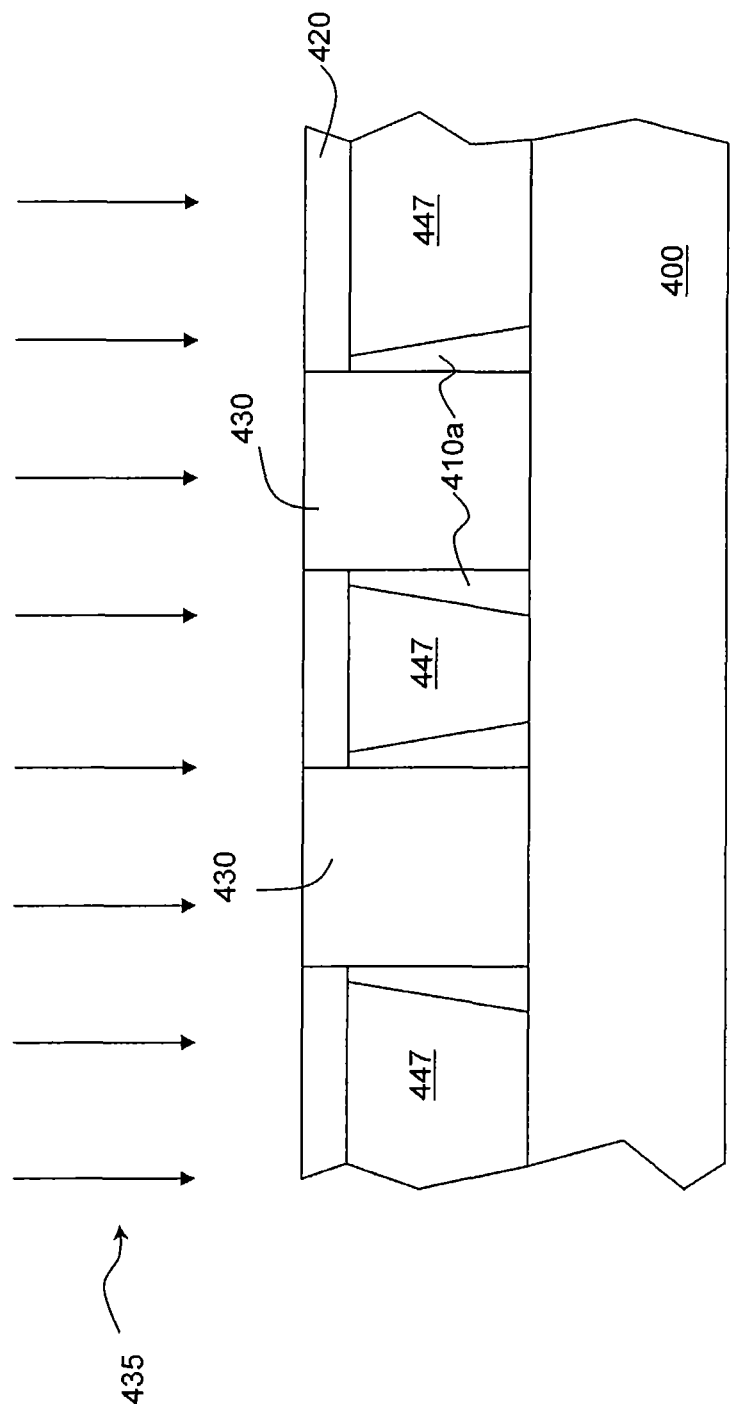

Referring to FIG. 4D, the structure show in FIG. 4C is subjected to a treatment 435 for at least partially removing the sacrificial layer 410b so as to form a structure with air gap 437. The treatment 435 may be similar to, for example, the treatment 235 show in FIG. 2D.

Figure 4E:
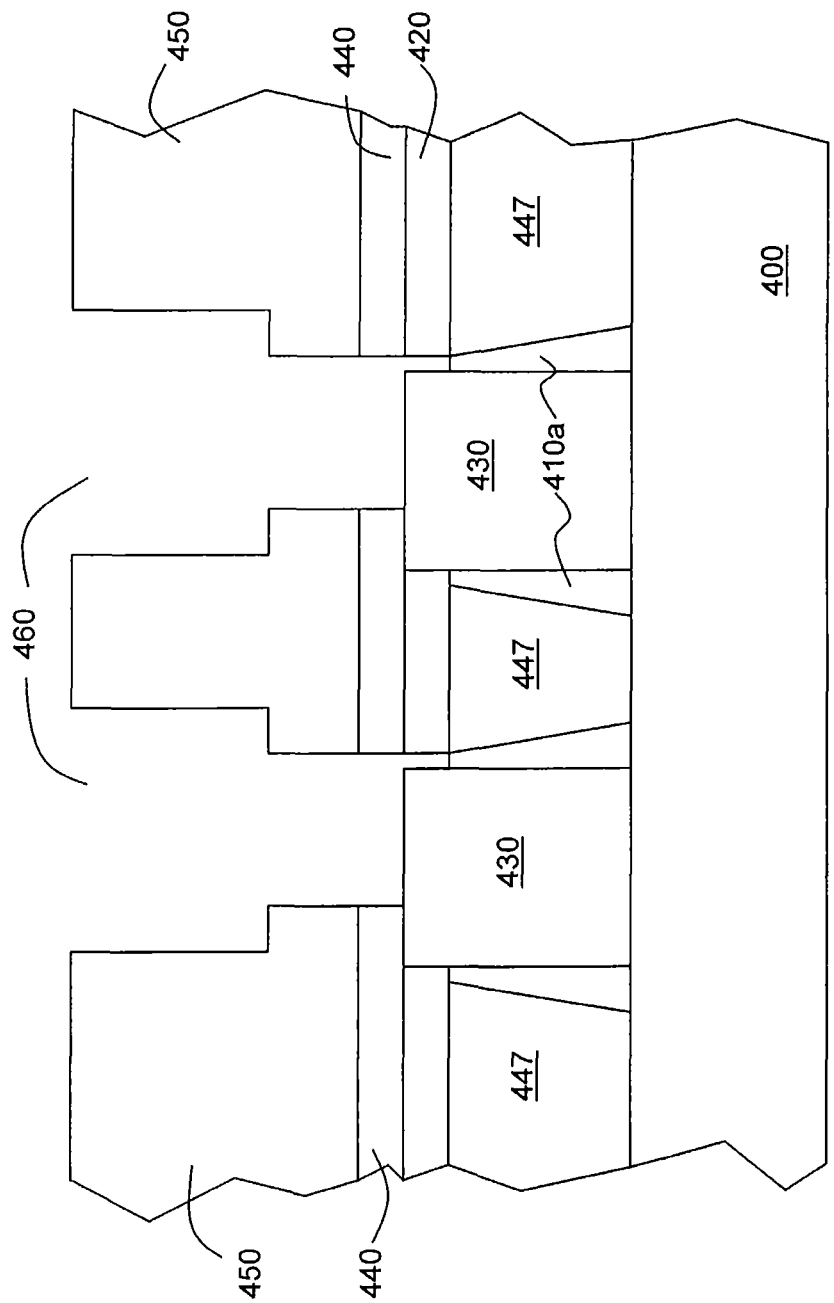
FIG. 4E is a schematic cross-sectional view of an exemplary interconnect structure with misalignment.

FIG. 4E is a schematic cross-sectional view of an exemplary interconnect structure with misalignment.

Referring to FIG. 4E, an etch stop layer 440 and a dielectric layer 450 are sequentially formed over the structure of FIG. 4D. Openings 460 are formed within the etch stop layer 440 and the dielectric layer 450. The materials and methods for forming the etch stop layer 440 and the dielectric layer 450 may be similar to, for example, the etch stop layer 250a and the dielectric layer 260a shown in FIG. 3B. In some embodiments, the methods for forming the openings 460 may be similar to those for forming the openings 275 shown in FIG. 3B.

The hardened regions or layers 410a on the sidewalls of the conductive structures 430. The hardened layers 410a may increase dielectric back pressures. The layers 410a might enhance adhesion of the conductive structures 430 to the dielectric layer 420 or the substrate 400 such that the reliability of the interconnect structure is desirably achieved. Further, the hardened layers 410a may serve as protection layers for an etch process. When the openings 460 are formed within the dielectric layer 450 and the etch stop layer 440, the etch step for forming the openings 460 may partially expose the top surface of the hardened layers 410a through the dielectric layer 420 while misalignment occurs. The hardened layers 410 may desirably support the structures formed thereover.

In some embodiments, the exemplary methods shown in FIGS. 4A-4D may be cooperated with the exemplary methods shown in FIGS. 2A-2J in order to achieve desired interconnect structures with air gaps.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor structure, comprising:
    a plurality of first conductive structures over a substrate;
    at least one structure containing an air-gap between two of the first conductive structures;
    at least one permeable hard mask layer between the two of the first conductive structures, the permeable hard mask layer sealing the air-gap;
    a first dielectric layer over the permeable hard mask layer, wherein the first dielectric layer does not substantially contact top surfaces of the first conductive structures; and
    a second dielectric layer over the first dielectric layer, the second dielectric layer comprising at least one second conductive structure therein, and the second conductive structure contacting one of the first conductive structures,
    wherein the second conductive structure includes a via partly contained within the second dielectric layer.

2. The structure of claim 1, further comprising an etch stop layer between the first dielectric layer and the second dielectric layer, wherein the via is partly contained within the etch stop layer.

3. The semiconductor structure of claim 2, further comprising a cap layer between the etch stop layer and the first conductive structures, wherein the cap layer does not contact a top surface of the first dielectric layer, and the via is partly contained in the cap layer.

4. The semiconductor structure of claim 1, wherein the permeable hard mask layer is a porous low-k dielectric layer.

5. The semiconductor structure of claim 1, wherein the first dielectric layer contains mecaptopropyltrimethoxysilane (MPTMS).

6. The semiconductor structure of claim 1, wherein the first dielectric layer contains at least one of nitrogen, oxygen and carbon, and the first dielectric layer is denser than the permeable hard mask layer.

7. The semiconductor structure of claim 1, wherein the second conductive structure contacts the first dielectric layer extending from a top surface of one of the first conductive structures, a sidewall of the first dielectric layer and at least a part of a top surface of the first dielectric layer.

8. A semiconductor structure, comprising:
    a plurality of first conductive structures over a substrate;
    at least one structure containing an air-gap between two of the first conductive structures;
    at least one permeable hard mask layer between the two of the first conductive structures, the permeable hard mask layer sealing the air-gap;
    a first dielectric layer over the permeable hard mask layer, wherein the first dielectric layer does not substantially contact top surfaces of the first conductive structures; and
    a second dielectric layer over the first dielectric layer, the second dielectric layer comprising at least one second conductive structure therein, and the second conductive structure contacting one of the first conductive structures,
    wherein the second conductive structure includes a conductive line layer entirely contained within the second dielectric layer.

9. The structure of claim 8, further comprising an etch stop layer between the first dielectric layer and the second dielectric layer, further comprising a conductive via partly contained within the second dielectric layer and partly contained with the etch stop layer.

10. The semiconductor structure of claim 9, further comprising a cap layer between the etch stop layer and the first conductive structures, wherein the cap layer does not contact a top surface of the first dielectric layer.

11. The semiconductor structure of claim 8, wherein the permeable hard mask layer is a porous low-k dielectric layer.

12. The semiconductor structure of claim 8, wherein the first dielectric layer contains mecaptopropyltrimethoxysilane (MPTMS).

13. The semiconductor structure of claim 8, wherein the first dielectric layer contains at least one of nitrogen, oxygen and carbon, and the first dielectric layer is denser than the permeable hard mask layer.

14. The semiconductor structure of claim 8, wherein the second conductive structure contacts the first dielectric layer extending from a top surface of one of the first conductive structures, a sidewall of the first dielectric layer and at least a part of a top surface of the first dielectric layer.

15. A semiconductor structure, comprising:
   a plurality of first conductive structures over a substrate;
   at least one structure containing an air-gap between two of the first conductive structures;
   at least one permeable hard mask layer between the two of the first conductive structures, the permeable hard mask layer sealing the air-gap;
   a first dielectric layer over the permeable hard mask layer, wherein the first dielectric layer does not substantially contact top surfaces of the first conductive structures;
   a second dielectric layer over the first dielectric layer, the second dielectric layer comprising at least one second conductive structure therein, and the second conductive structure contacting one of the first conductive structures, and
   third dielectric layers on sidewalls of the first conductive structures, wherein the third dielectric layers comprise a photosensitive porogen material.

16. The structure of claim 15, wherein the photosensitive porogen material is a negative tone material.

17. The structure of claim 15, wherein the photosensitive porogen material is radiation hardened.

18. The structure of claim 15, wherein the third dielectric material is wider at a bottom of the sidewalls than at a top of the sidewalls.

19. The semiconductor structure of claim 15, further comprising an etch stop layer wherein openings are formed within the second dielectric layer and the etch stop layer, so as to partially expose the top surface of the third dielectric layers through the first dielectric layer.

20. The semiconductor structure of claim 15, wherein the second conductive structure contacts the first dielectric layer extending from a top surface of one of the first conductive structures, a sidewall of the first dielectric layer and at least a part of a top surface of the first dielectric layer.

\* \* \* \* \*